United States Patent
Seki

(10) Patent No.: US 10,903,835 B2
(45) Date of Patent: Jan. 26, 2021

(54) HIGH FREQUENCY SWITCH

(71) Applicant: Murata Manufacturing Co., Ltd., Kyoto (JP)

(72) Inventor: Kenta Seki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/777,123

(22) Filed: Jan. 30, 2020

(65) Prior Publication Data

US 2020/0169256 A1 May 28, 2020

Related U.S. Application Data

(63) Continuation of application No. PCT/JP2018/028071, filed on Jul. 26, 2018.

(30) Foreign Application Priority Data

Aug. 1, 2017 (JP) .................................. 2017-148755

(51) Int. Cl.
  *H03K 17/693* (2006.01)
  *H04B 1/48* (2006.01)

(52) U.S. Cl.
  CPC ............. *H03K 17/693* (2013.01); *H04B 1/48* (2013.01)

(58) Field of Classification Search
  CPC ................................ H03K 17/693; H04B 1/48
  See application file for complete search history.

(56) References Cited

U.S. PATENT DOCUMENTS 6,653,697 B2 * 11/2003 Hidaka ................ H03K 17/693
  257/275
6,995,630 B2 * 2/2006 Satoh ....................... H04B 1/48
  333/101

(Continued)

FOREIGN PATENT DOCUMENTS

JP  H04-287360 A  10/1992
JP  2003-152009 A  5/2003

(Continued)

OTHER PUBLICATIONS

International Search Report for International Application No. PCT/JP2018/028071, dated Oct. 16, 2018.

(Continued)

*Primary Examiner* — Dinh T Le
(74) *Attorney, Agent, or Firm* — Pearne & Gordon LLP

(57) ABSTRACT

A length of a zone in which a power propagation direction from an input/output terminal (P251) toward a common terminal (P20) and a power propagation direction from the common terminal (P20) toward an external connection terminal (P10) are opposite to each other is longer than a length of a zone in which a power propagation direction from an input/output terminal (P211) toward the common terminal (P20) and a power propagation direction from the common terminal (P20) toward the external connection terminal (P10) are opposite to each other. A FET (251) and a FET (211) have structures that power transferred between a drain and a source of the FET (251) in accordance with predetermined input power is greater than power transferred between a drain and a source of the FET (211).

20 Claims, 6 Drawing Sheets

(56) References Cited

U.S. PATENT DOCUMENTS

| | | | |
|---|---|---|---|
| 8,698,574 B2* | 4/2014 | Sugiura | H03K 17/6874 |
| | | | 333/101 |
| 2003/0094679 A1 | 5/2003 | Asano et al. | |
| 2003/0137044 A1 | 7/2003 | Asano et al. | |
| 2004/0227666 A1* | 11/2004 | Adachi | H01P 1/15 |
| | | | 343/700 MS |
| 2009/0315524 A1 | 12/2009 | Okuda | |
| 2014/0043206 A1 | 2/2014 | Ahn et al. | |
| 2015/0348993 A1 | 12/2015 | Kunishi et al. | |

FOREIGN PATENT DOCUMENTS

| | | |
|---|---|---|
| JP | 2003-204009 A | 7/2003 |
| JP | 2010-027030 A | 2/2010 |
| JP | 2010-074027 A | 4/2010 |
| JP | 2015-530798 A | 10/2015 |
| JP | 2015-226262 A | 12/2015 |

OTHER PUBLICATIONS

Written Opinion for International Application No. PCT/JP2018/028071, dated Oct. 16, 2018.

* cited by examiner

HIGH FREQUENCY SWITCH

This is a continuation of International Application No. PCT/JP2018/028071 filed on Jul. 26, 2018 which claims priority from Japanese Patent Application No. 2017-148755 filed on Aug. 1, 2017. The contents of these applications are incorporated herein by reference in their entireties.

BACKGROUND OF THE DISCLOSURE

Field of the Disclosure

The present disclosure relates to a high frequency switch selectively connecting a plurality of input/output terminals to a common terminal.

Description of the Related Art

Up to now, a high frequency switch is often utilized in a high frequency module. For example, the high frequency switch is connected between an antenna common to multiple types of communication signals and a transmitting/receiving circuit arranged for each of the multiple types of communication signals. The high frequency switch includes a common terminal and a plurality of input/output terminals. The common terminal is connected to the antenna, and the plurality of input/output terminals are each connected to the transmitting/receiving circuit for the corresponding one among the multiple types of communication signals.

A high frequency switch using a semiconductor, such as disclosed in Patent Document 1, is utilized as the above-described high frequency switch in many cases. The high frequency switch disclosed in Patent Document 1 includes a plurality of FETs (field effect transistors). The plurality of FETs are each connected between the common terminal and the corresponding one among the plurality of input/output terminals. The high frequency switch selectively connects one among the plurality of input/output terminals to the common terminal by controlling the plurality of FETs to be opened or conducted.

Patent Document 1: Japanese Unexamined Patent Application Publication No. 2010-74027

BRIEF SUMMARY OF THE DISCLOSURE

However, when the high frequency switch is formed using a semiconductor, a deviation in insertion loss may occur among the transfer paths connecting the common terminal and the plurality of input/output terminals in some cases depending on the positional relations between the common terminal and the plurality of input/output terminals. In other words, a difference in insertion loss may occur among the transmission signals.

Accordingly, an object of the present disclosure is to reduce the deviation in insertion loss among the transfer paths connecting the common terminal and the plurality of input/output terminals individually.

(1) A high frequency switch according to the present disclosure includes a semiconductor element in which a first plurality of FETs including at least a first FET and a second FET are provided, a plurality of external connection terminals, and a molded member encapsulating the semiconductor element. The semiconductor element includes a common terminal, a plurality of input/output terminals including at least a first terminal and a second terminal, the first FET connected between the common terminal and the first terminal, and the second FET connected between the common terminal and the second terminal. The plurality of external connection terminals include a common-terminal-dedicated external connection terminal connected to the common terminal, a first external connection terminal connected to the first terminal, and a second external connection terminal connected to the second terminal. In a configuration satisfying that a length of a zone in which a signal propagation direction from the first external connection terminal toward the common terminal and a signal propagation direction from the common terminal toward the common-terminal-dedicated external connection terminal are opposite to each other is longer than a length of a zone in which a signal propagation direction from the second external connection terminal toward the common terminal and a signal propagation direction from the common terminal toward the common-terminal-dedicated external connection terminal are opposite to each other, the first FET and the second FET are configured such that power of a signal transferred between a drain and a source of the first FET in accordance with predetermined input power is greater than power of a signal transferred between a drain and a source of the second FET.

With those features, even when there is a difference in insertion loss for a communication signal per external connection terminal due to the different lengths of the zones in which the signal propagation directions are opposite to each other, that difference is cancelled by a difference in resistance of FET for each communication signal.

(2) A high frequency switch according to the present disclosure includes a semiconductor element in which a first plurality of FETs including at least a first FET and a second FET are provided, a plurality of external connection terminals, and a molded member encapsulating the semiconductor element. The semiconductor element includes a common terminal, a plurality of input/output terminals including at least a first terminal and a second terminal, the first FET connected between the common terminal and the first terminal, and the second FET connected between the common terminal and the second terminal. The plurality of external connection terminals include a common-terminal-dedicated external connection terminal connected to the common terminal, a first external connection terminal connected to the first terminal, and a second external connection terminal connected to the second terminal. In a configuration satisfying that a length of a zone in which a signal propagation direction from the first external connection terminal toward the common terminal and a signal propagation direction from the common terminal toward the common-terminal-dedicated external connection terminal are opposite to each other is longer than a length of a zone in which a signal propagation direction from the second external connection terminal toward the common terminal and a signal propagation direction from the common terminal toward the common-terminal-dedicated external connection terminal are opposite to each other, and a gate width of the first FET is wider than a gate width of the second FET.

With that feature, the difference in resistance of FET for each communication signal can be realized with a simple structure.

(3) The high frequency switch according to the present disclosure is preferably constituted as follows. The high frequency switch further includes a first wiring conductor connected between the first external connection terminal and the first terminal, a second wiring conductor connected between the second external connection terminal and the second terminal, and a third wiring conductor connected between the common terminal and the common-terminaldedicated external connection terminal. The signal propagation direction from the first external connection terminal toward the common terminal is a signal propagation direction in the first wiring conductor, the signal propagation direction from the second external connection terminal toward the common terminal is a signal propagation direction in the second wiring conductor, and the signal propagation direction from the common terminal toward the common-terminal-dedicated external connection terminal is a signal propagation direction in the third wiring conductor.

With those features, the signal propagation directions are defined by the first wiring conductor, the second wiring conductor, and the third wiring conductor. Even when the above configuration causes a difference in insertion loss for a communication signal per external connection terminal due to the different lengths of the zones in which the signal propagation directions are opposite to each other, that difference is cancelled by the difference in resistance of FET for each communication signal.

(4) The high frequency switch according to the present disclosure is preferably constituted as follows. The high frequency switch has a region in which the signal propagation direction from the first external connection terminal toward the common terminal and the signal propagation direction from the common terminal toward the common-terminal-dedicated external connection terminal are opposite to each other. The high frequency switch does not have a region in which the signal propagation direction from the second external connection terminal toward the common terminal and the signal propagation direction from the common terminal toward the common-terminal-dedicated external connection terminal are opposite to each other.

With those features, because of including a transfer path having a region in which the signal propagation direction is reversed and a transfer path having a region in which the signal propagation direction is not reversed, the high frequency switch can realize a state that the lengths of the zones in which the signal propagation directions are opposite to each other are different.

(5) The high frequency switch according to the present disclosure is preferably constituted as follows. An angle provided by an extension line of the first wiring conductor and an extension line of the third wiring conductor is an acute angle. An angle provided by an extension line of the second wiring conductor and the extension line of the third wiring conductor is an obtuse angle.

With those features, the configuration including the transfer path having the region in which the signal propagation direction is reversed and the transfer path having the region in which the signal propagation direction is not reversed is realized with physical arrangement of the wiring conductors.

(6) The high frequency switch according to the present disclosure may be constituted as follows. The first terminal and the second terminal are aligned in a first direction of the semiconductor element, and the common terminal is arranged between the first terminal and the second terminal in the first direction.

With those features, the region in which the signal propagation direction is reversed is generated with regard to the first terminal, and the region in which the signal propagation direction is reversed is not generated with regard to the second terminal. In other words, the above features create the configuration providing the different lengths of the zones in which the signal propagation directions are opposite to each other. Even in such a case, the difference in insertion loss can be canceled, as described above, by the difference in resistance of FET for each communication signal. Moreover, with the above features, the length of a wiring connecting the common terminal to the common-terminal-dedicated external connection terminal can be increased and impedance matching can be easily made.

(7) The high frequency switch according to the present disclosure is preferably constituted as follows. The semiconductor element further includes a second plurality of FETs each connected between corresponding ones among the plurality of input/output terminals and the common terminal. The plurality of input/output terminals and the second plurality of FETs are arranged in a state arrayed in the first direction and a second direction perpendicular to the first direction.

With those features, the arrangement of the plurality of input/output terminals and the plurality of FETs is well balanced. It is hence easier to realize a configuration in which differences in path lengths from the plurality of input/output terminals and the plurality of FETs to the common terminal are smaller.

(8) In the high frequency switch according to the present disclosure, preferably, the common-terminal-dedicated external connection terminal is positioned on a same side as the first external connection terminal and on an opposite side to the second external connection terminal with respect to a linear line parallel to the second direction and intersecting with the common terminal.

With those features, the configuration including the transfer path having the region in which the signal propagation direction is reversed and the transfer path having the region in which the signal propagation direction is not reversed is realized with physical arrangement of the wiring conductors.

(9) In the high frequency switch according to the present disclosure, preferably, the common terminal is arranged substantially at a center when the semiconductor element is viewed in a plan view.

With that feature, it is easier to realize the configuration in which the differences in path lengths from the plurality of input/output terminals and the plurality of FETs to the common terminal are smaller. Furthermore, the length of the wiring connecting the common terminal to the common-terminal-dedicated external connection terminal can be increased and impedance matching can be more easily made.

According to the present disclosure, the deviation in insertion loss among the transfer paths connecting the common terminal and the plurality of input/output terminals individually can be reduced.

DETAILED DESCRIPTION OF THE DISCLOSURE

Figure 1A:
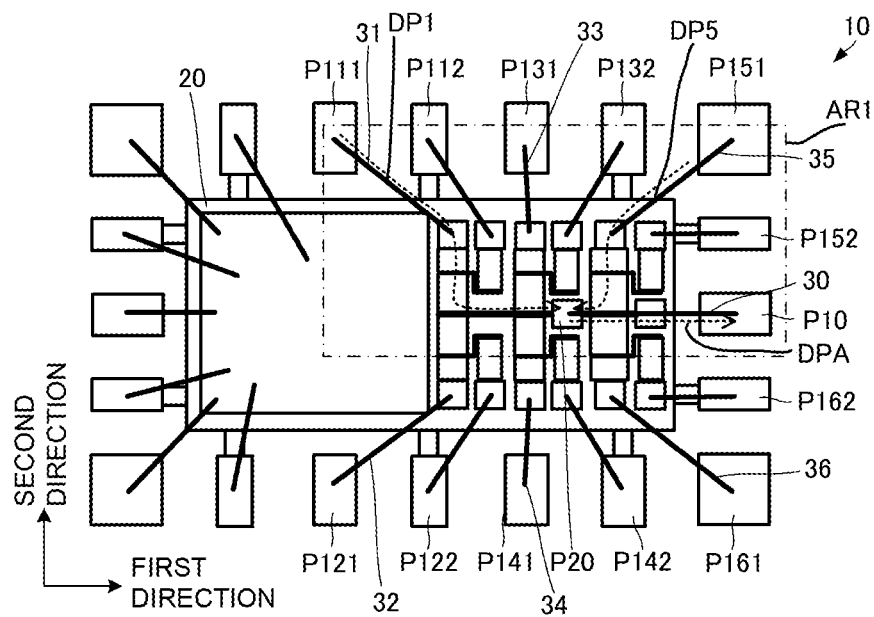
FIG. 1A is a plan view illustrating a layout of individual terminals and power propagation directions in a high frequency switch 10 according to a first embodiment of the present disclosure.
Figure 1B:
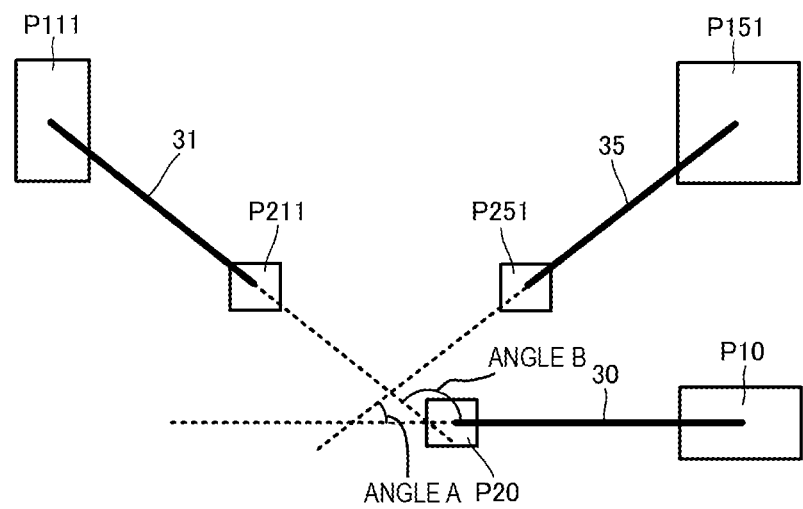
FIG. 1B is a partial enlarged view illustrating, in an enlarged scale, a portion corresponding to an area AR1 in FIG. 1A.
Figure 2:
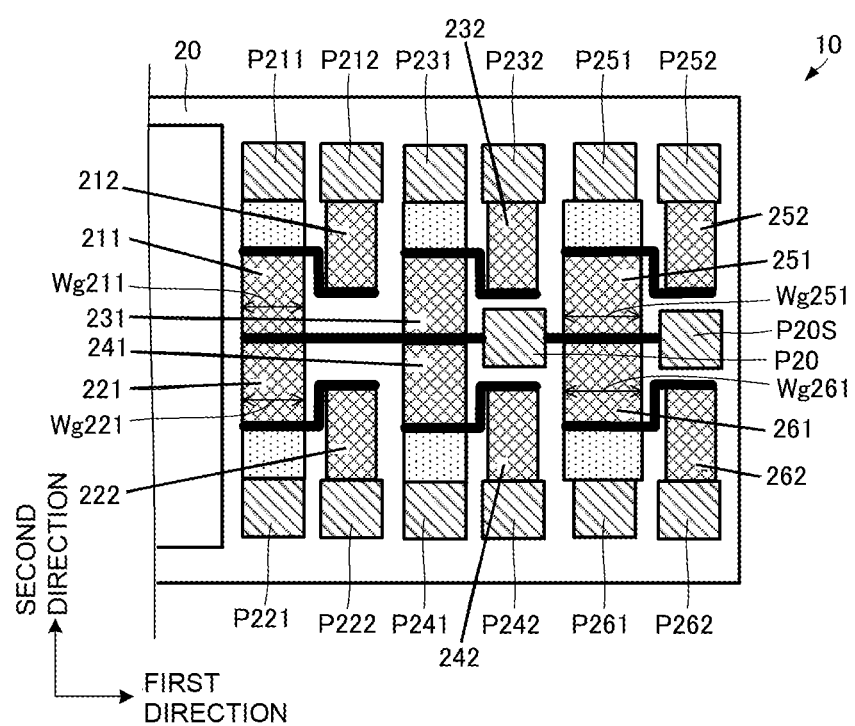
FIG. 2 is a plan view illustrating, in an enlarged scale, a portion of a semiconductor element 20 in the high frequency switch 10 according to the first embodiment of the present disclosure.
Figure 3:
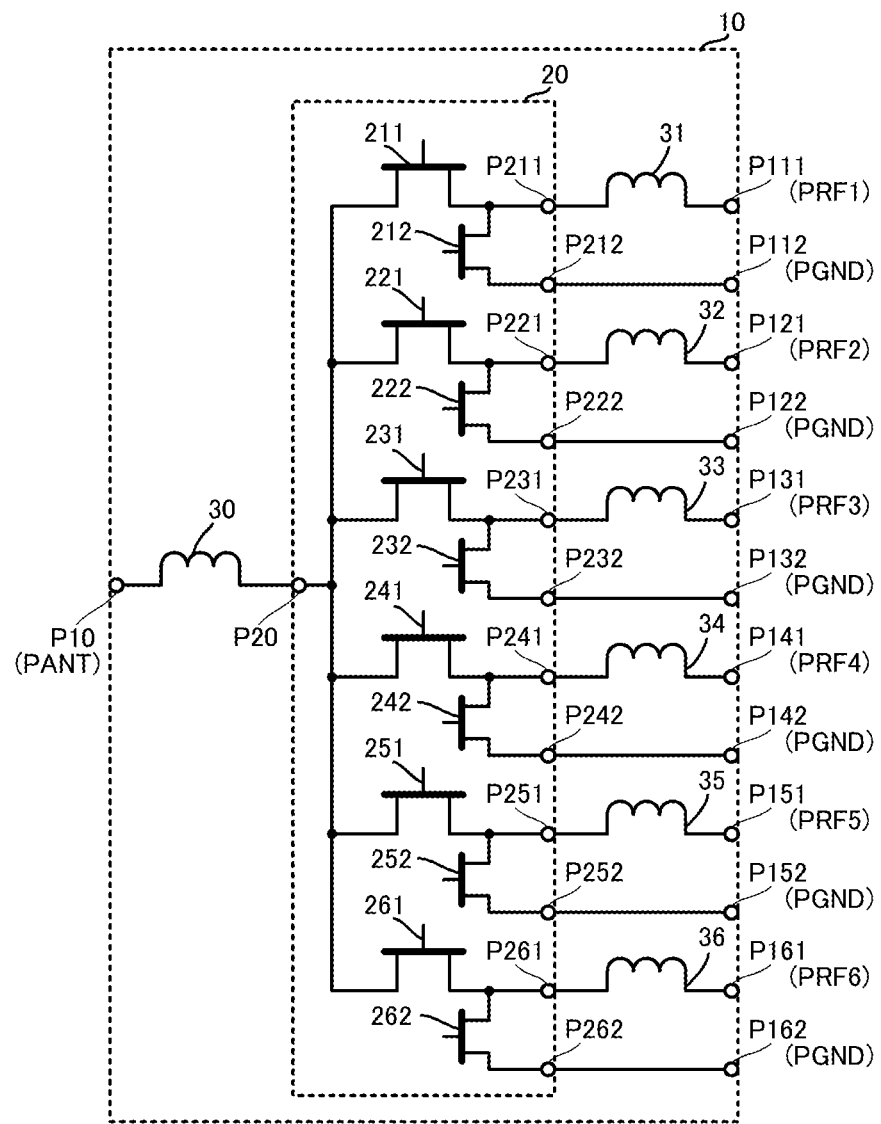
FIG. 3 is a circuit diagram of the high frequency switch 10 according to the first embodiment of the present disclosure.

A high frequency switch according to a first embodiment of the present disclosure will be described below with reference to the drawings. FIG. 1A is a plan view illustrating a layout of individual terminals and power propagation directions in a high frequency switch 10 according to the first embodiment of the present disclosure. FIG. 1B is a partial enlarged view illustrating, in an enlarged scale, a portion corresponding to an area AR1 in FIG. 1A. For easier understanding of the features illustrated in FIG. 1B, only necessary components are illustrated, and other components are omitted in FIG. 1B. FIG. 2 is a plan view illustrating, in an enlarged scale, a portion of a semiconductor element 20 in the high frequency switch 10 according to the first embodiment of the present disclosure. FIG. 3 is a circuit diagram of the high frequency switch 10 according to the first embodiment of the present disclosure.

(Circuit Configuration of High Frequency Switch)

The high frequency switch 10 has a circuit configuration illustrated in FIG. 3. As illustrated in FIG. 3, the high frequency switch 10 includes a semiconductor element 20 and a plurality of external connection terminals P10, P111, P112, P121, P122, P131, P132, P141, P142, P151, P152, P161 and P162.

The external connection terminal P10 is connected to an antenna in a high frequency front-end module into which the high frequency switch 10 is incorporated. The external connection terminals P111, P121, P131, P141, P151 and P161 are each connected to corresponding one of transmitting/receiving circuits (including transmitting circuits or receiving circuits) for communication signals in the high frequency front-end module into which the high frequency switch 10 is incorporated. The external connection terminals P112, P122, P132, P142, P152 and P162 are connected to a ground terminal in the high frequency front-end module into which the high frequency switch 10 is incorporated.

The external connection terminal P10 corresponds to a "common-terminal-dedicated external connection terminal" in the present disclosure. The external connection terminal P151 and the external connection terminal P161 correspond to a "first external connection terminal" in the present disclosure. The external connection terminal P111, the external connection terminal P121, the external connection terminal P131, and the external connection terminal P141 correspond to a "second external connection terminal" in the present disclosure.

Though not illustrated, the high frequency switch 10 further includes external connection terminals for supplying the power and inputting the control signals to the semiconductor element 20.

The semiconductor element 20 includes a plurality of FETs 211, 212, 221, 222, 231, 232, 241, 242, 251, 252, 261 and 262. The FET 251 and the FET 261 correspond to a "first FET" in the present disclosure, and the FETs 211, 221, 231 and 241 correspond to a "second FET" in the present disclosure. The semiconductor element 20 further includes a common terminal P20, a plurality of input/output terminals P211, P221, P231, P241, P251 and P261, and a plurality of ground terminals P212, P222, P232, P242, P252 and P262.

The input/output terminals P251 and P261 correspond to a "first terminal" in the present disclosure, and the input/output terminals P211, P221, P231 and P241 correspond to a "second terminal" in the present disclosure.

The FET 211 is connected between the common terminal P20 and the input/output terminal P211. The FET 212 is connected between a ground terminal P212 and a junction between the FET 211 and the input/output terminal P211. Continuity between the common terminal P20 and the input/output terminal P211 is established by making the FET 211 conducted between a drain and a source and the FET 212 opened between a drain and a source. On the other hand, the continuity between the common terminal P20 and the input/output terminal P211 is released by making the FET 211 opened between the drain and the source and the FET 212 conducted between the drain and the source.

The FET 221 is connected between the common terminal P20 and the input/output terminal P221. The FET 222 is connected between a ground terminal P222 and a junction between the FET 221 and the input/output terminal P221. Continuity between the common terminal P20 and the input/output terminal P221 is established by making the FET 221 conducted between a drain and a source and the FET 222 opened between a drain and a source. On the other hand, the continuity between the common terminal P20 and the input/output terminal P221 is released by making the FET 221 opened between the drain and the source and the FET 222 conducted between the drain and the source.

The FET 231 is connected between the common terminal P20 and the input/output terminal P231. The FET 232 is connected between a ground terminal P232 and a junction between the FET 231 and the input/output terminal P231. Continuity between the common terminal P20 and the input/output terminal P231 is established by making the FET 231 conducted between a drain and a source and the FET 232 opened between a drain and a source. On the other hand, the continuity between the common terminal P20 and the input/output terminal P231 is released by making the FET 231 opened between the drain and the source and the FET 232 conducted between the drain and the source.

The FET 241 is connected between the common terminal P20 and the input/output terminal P241. The FET 242 is connected between a ground terminal P242 and a junction between the FET 241 and the input/output terminal P241. Continuity between the common terminal P20 and the input/output terminal P241 is established by making the FET 241 conducted between a drain and a source and the FET 242 opened between a drain and a source. On the other hand, the continuity between the common terminal P20 and the input/output terminal P241 is released by making the FET 241 opened between the drain and the source and the FET 242 conducted between the drain and the source.

The FET 251 is connected between the common terminal P20 and the input/output terminal P251. The FET 252 is connected between a ground terminal P252 and a junction between the FET 251 and the input/output terminal P251. Continuity between the common terminal P20 and the input/output terminal P251 is established by making the FET 251 conducted between a drain and a source and the FET 252 opened between a drain and a source. On the other hand, the continuity between the common terminal P20 and the input/output terminal P251 is released by making the FET 251 opened between the drain and the source and the FET 252 conducted between the drain and the source.

The FET 261 is connected between the common terminal P20 and the input/output terminal P261. The FET 262 is connected between a ground terminal P262 and a junction between the FET 261 and the input/output terminal P261. Continuity between the common terminal P20 and the input/output terminal P261 is established by making the FET 261 conducted between a drain and a source and the FET 262 opened between a drain and a source. On the other hand, the continuity between the common terminal P20 and the input/output terminal P261 is released by making the FET 261 opened between the drain and the source and the FET 262 conducted between the drain and the source.

The external connection terminal P10 and the common terminal P20 are connected to each other through a wiring conductor 30.

The external connection terminal P111 and the input/output terminal P211 are connected to each other through a wiring conductor 31. The external connection terminal P121 and the input/output terminal P221 are connected to each other through a wiring conductor 32. The external connection terminal P131 and the input/output terminal P231 are connected to each other through a wiring conductor 33. The external connection terminal P141 and the input/output terminal P241 are connected to each other through a wiring conductor 34. The external connection terminal P151 and the input/output terminal P251 are connected to each other through a wiring conductor 35. The external connection terminal P161 and the input/output terminal P261 are connected to each other through a wiring conductor 36. The wiring conductors 35 and 36 correspond to a "first wiring conductor" in the present disclosure, the wiring conductors 31, 32, 33 and 34 correspond to a "second wiring conductor" in the present disclosure, and the wiring conductor 30 corresponds to a "third wiring conductor" in the present disclosure.

The external connection terminal P112 and the ground terminal P212, the external connection terminal P122 and the ground terminal P222, the external connection terminal P132 and the ground terminal P232, the external connection terminal P142 and the ground terminal P242, the external connection terminal P152 and the ground terminal P252, and the external connection terminal P162 and the ground terminal P262 are connected therebetween per pair through wiring conductors.

Furthermore, the external connection terminal P10 is positioned on the same side as the external connection terminals P151 and P161 and on the opposite side to the external connection terminals P111, P121, P131 and P141 with respect to a linear line that is parallel to a later-described second direction and intersects the common terminal P20.

(Structure of High Frequency Switch)

The high frequency switch 10 having the above-described circuit configuration includes a molded member in the shape of a rectangular parallelepiped. The molded member is formed of a resin mold, and the semiconductor element 20 is incorporated in the molded member. In other words, the semiconductor element 20 is encapsulated by the molded member. A plurality of external conductors are formed on a rear surface of the molded member. The plurality of external conductors are connected to the above-described external connection terminals P10, P111, P112, P121, P122, P131, P132, P141, P142, P151, P152, P161 and P162 by predetermined wiring patterns.

In addition to the above-described configuration, the semiconductor element 20 and the external connection terminals P10, P111, P112, P121, P122, P131, P132, P141, P142, P151, P152, P161 and P162 inside the molded member are constituted as illustrated in FIGS. 1A, 1B and 2.

The semiconductor element 20 is constituted as a rectangular parallelepiped providing, when viewed in a plan view, a rectangular shape when viewed in a plan view that has a first direction and a second direction perpendicular to each other.

As illustrated in FIG. 2, the FETs 211, 212, 221, 222, 231, 232, 241, 242, 251, 252, 261 and 262 are formed in the semiconductor element 20 by performing a predetermined doping process, etc. on a semiconductor substrate. The FETs 211, 212, 221, 222, 231, 232, 241, 242, 251, 252, 261 and 262 are each formed such that a direction in which the drain and the source are connected is parallel to the second direction of the semiconductor element 20. Moreover, circuits for a power supply system and a control system are formed in the semiconductor element 20. An area where the FETs 211, 212, 221, 222, 231, 232, 241, 242, 251, 252, 261 and 262 are formed and an area where the circuits for the power supply system and the control system are formed are arrayed in the first direction.

The FETs 211, 212, 231, 232, 251 and 252 are arranged at intervals to align in the first direction of the semiconductor element 20. The FETs 221, 222, 241, 242, 261 and 262 are arranged at intervals to align in the first direction of the semiconductor element 20.

Furthermore, the FETs 211, 212, 231, 232, 241, 251 and 252 and the FETs 221, 222, 241, 242, 261 and 262 are arranged in line-symmetry with respect to a reference line that is defined by a linear line passing a center of the semiconductor element 20 in the second direction and being parallel to the first direction. The FETs 211, 212, 231, 232, 251 and 252 are arranged on the one-end side in the second direction with respect to the reference line. The FETs 221, 222, 241, 242, 261 and 262 are arranged on the other-end side in the second direction with respect to the reference line.

The common terminals P20 and P20S, the plurality of input/output terminals P211, P221, P231, P241, P251 and P261 and the plurality of ground terminals P212, P222, P232, P242, P252 and P262 are formed on the surface of the semiconductor element 20. Those terminals are each rectangular when viewed in a plan view.

The input/output terminal P211, the ground terminal P212, the input/output terminal P231, the ground terminal P232, the input/output terminal P251, and the ground terminal P252 are arranged at intervals in the mentioned order to align in the first direction of the semiconductor element 20.

The input/output terminal P221, the ground terminal P222, the input/output terminal P241, the ground terminal P242, the input/output terminal P261, and the ground terminal P262 are arranged at intervals in the mentioned order to align in the first direction of the semiconductor element 20.

Moreover, the input/output terminal P211, the ground terminal P212, the input/output terminal P231, the ground terminal P232, the input/output terminal P251, and the ground terminal P252 are arranged in line-symmetric relation to the input/output terminal P221, the ground terminal P222, the input/output terminal P241, the ground terminal P242, the input/output terminal P261, and the ground terminal P262 with respect to the above-described reference line.

In addition, the input/output terminal P211 is arranged on the one-end side of the semiconductor element 20 in the second direction relative to the FET 211, and the positions of the input/output terminal P211 and the FET 211 in the first direction are substantially the same. The input/output terminal P211 is connected to the FET 211 by a wiring pattern formed on the semiconductor element 20.

The ground terminal P212 is arranged on the one-end side of the semiconductor element 20 in the second direction relative to the FET 212, and the positions of the ground terminal P212 and the FET 212 in the first direction are substantially the same. The ground terminal P212 is connected to the FET 212. The FET 212 is connected to the wiring pattern for both the FET 211 and the input/output terminal P211 by a wiring pattern formed on the semiconductor element 20.

The input/output terminal P231 is arranged on the one-end side of the semiconductor element 20 in the second direction relative to the FET 231, and the positions of the input/output terminal P231 and the FET 231 in the first direction are substantially the same. The input/output terminal P231 is connected to the FET 231 by a wiring pattern formed on the semiconductor element 20.

The ground terminal P232 is arranged on the one-end side of the semiconductor element 20 in the second direction relative to the FET 232, and the positions of the ground terminal P232 and the FET 232 in the first direction are substantially the same. The ground terminal P232 is connected to the FET 232. The FET 232 is connected to the wiring pattern for both the FET 231 and the input/output terminal P231 by a wiring pattern formed on the semiconductor element 20.

The input/output terminal P251 is arranged on the one-end side of the semiconductor element 20 in the second direction relative to the FET 251, and the positions of the input/output terminal P251 and the FET 251 in the first direction are substantially the same. The input/output terminal P251 is connected to the FET 251 by a wiring pattern formed on the semiconductor element 20.

The ground terminal P252 is arranged on the one-end side of the semiconductor element 20 in the second direction relative to the FET 252, and the positions of the ground terminal P252 and the FET 252 in the first direction are substantially the same. The ground terminal P252 is connected to the FET 252. The FET 252 is connected to the wiring pattern for both the FET 251 and the input/output terminal P251 by a wiring pattern formed on the semiconductor element 20.

The input/output terminal P221 is arranged on the other-end side of the semiconductor element 20 in the second direction relative to the FET 221, and the positions of the input/output terminal P221 and the FET 221 in the first direction are substantially the same. The input/output terminal P221 is connected to the FET 221 by a wiring pattern formed on the semiconductor element 20.

The ground terminal P222 is arranged on the other-end side of the semiconductor element 20 in the second direction relative to the FET 222, and the positions of the ground terminal P222 and the FET 222 in the first direction are substantially the same. The ground terminal P222 is connected to the FET 222. The FET 222 is connected to the wiring pattern for both the FET 221 and the input/output terminal P221 by a wiring pattern formed on the semiconductor element 20.

The input/output terminal P241 is arranged on the other-end side of the semiconductor element 20 in the second direction relative to the FET 241, and the positions of the input/output terminal P241 and the FET 241 in the first direction are substantially the same. The input/output terminal P241 is connected to the FET 241 by a wiring pattern formed on the semiconductor element 20.

The ground terminal P242 is arranged on the other-end side of the semiconductor element 20 in the second direction relative to the FET 242, and the positions of the ground terminal P242 and the FET 242 in the first direction are substantially the same. The ground terminal P242 is connected to the FET 242. The FET 242 is connected to the wiring pattern for both the FET 241 and the input/output terminal P241 by a wiring pattern formed on the semiconductor element 20.

The input/output terminal P261 is arranged on the other-end side of the semiconductor element 20 in the second direction relative to the FET 261, and the positions of the input/output terminal P261 and the FET 261 in the first direction are substantially the same. The input/output terminal P261 is connected to the FET 261 by a wiring pattern formed on the semiconductor element 20.

The ground terminal P262 is arranged on the other-end side of the semiconductor element 20 in the second direction relative to the FET 262, and the positions of the ground terminal P262 and the FET 262 in the first direction are substantially the same. The ground terminal P262 is connected to the FET 262. The FET 262 is connected to the wiring pattern for both the FET 261 and the input/output terminal P261 by a wiring pattern formed on the semiconductor element 20.

The common terminal P20 is formed at a center position of the semiconductor element 20 in the second direction while it locates substantially at a center position of an area of the semiconductor element 20, viewed in the first direction, where the plurality of FETs and input/output terminals are formed. The common terminal P20S is formed at a center position of the semiconductor element 20 in the second direction and at one end of the semiconductor element 20 (i.e., at an end on the opposite side to the circuits for the power supply system and the control system) in the first direction.

The common terminals P20 and P20S are connected to each other by a wiring pattern extending parallel to the first direction. The common terminals P20 and P20S are further connected to the FETs 211, 221, 231, 241, 251 and 261 by the above wiring pattern. The common terminal P20 is arranged between the input/output terminal P251 and the input/output terminal P211 in the first direction.

In the above-described configuration, with respect to the wiring pattern connected to the common terminal P20, the FETs 211, 231 and 251 are arranged on the one-end side in the second direction, and the FETs 221, 241 and 261 are arranged on the other-end side in the second direction. Furthermore, the FETs 211, 231 and 251 and the FETs 221, 241 and 261 are arranged in line-symmetry with respect to the above-mentioned wiring pattern.

Moreover, in the above-described configuration, the FETs 211, 221, 231 and 241 are arranged on the side closer to the circuits for the power supply system and the control system with respect to the common terminal P20, and the FETs 251 and 261 are arranged on the opposite side to the circuits for the power supply system and the control system with respect to the common terminal P20.

On the semiconductor element 20 described above, the wiring conductors 30, 31, 32, 33, 34, 35 and 36 are formed as illustrated in FIG. 1A. The wiring conductors 30, 31, 32, 33, 34, 35 and 36 are formed of conductive wires.

The wiring conductor 30 connects the common terminal P20 and the external connection terminal P10. The external connection terminal P10 is arranged at a position outward of the one end of the semiconductor element 20 in the first direction.

The wiring conductor 31 connects the input/output terminal P211 and the external connection terminal P111 almost linearly when viewed in a plan view. The external connection terminal P111 is arranged at a position outward of one end of the semiconductor element 20 in the second direction and on the side closer to the other end of the semiconductor element 20 (i.e., on the side closer to the circuits for the power supply system and the control system) than the input/output terminal P211 in the first direction.

The wiring conductor 32 connects the input/output terminal P221 and the external connection terminal P121 almost linearly when viewed in a plan view. The external connection terminal P121 is arranged at a position outward of the other end of the semiconductor element 20 in the second direction and on the side closer to the other end of the semiconductor element 20 (i.e., on the side closer to the circuits for the power supply system and the control system) than the input/output terminal P221 in the first direction.

The wiring conductor 33 connects the input/output terminal P231 and the external connection terminal P131 almost linearly when viewed in a plan view. The external connection terminal P131 is arranged at a position outward of the one end of the semiconductor element 20 in the second direction and substantially at substantially the same position as the input/output terminal P231 on the side closer to the other end of the semiconductor element 20 (i.e., on the side closer to the circuits for the power supply system and the control system) than the input/output terminal P231 in the first direction.

The wiring conductor 34 connects the input/output terminal P241 and the external connection terminal P141 almost linearly when viewed in a plan view. The external connection terminal P141 is arranged at a position outward of the other end of the semiconductor element 20 in the second direction and on the side closer to the other end of the semiconductor element 20 (i.e., on the side closer to the circuits for the power supply system and the control system) than the input/output terminal P241 in the first direction.

The wiring conductor 35 connects the input/output terminal P251 and the external connection terminal P151 almost linearly when viewed in a plan view. The external connection terminal P151 is arranged at a position outward of the one end of the semiconductor element 20 in the second direction and on the side closer to the one end of the semiconductor element 20 (i.e., on the opposite side to the circuits for the power supply system and the control system) than the input/output terminal P251 in the first direction.

The wiring conductor 36 connects the input/output terminal P261 and the external connection terminal P161 almost linearly when viewed in a plan view. The external connection terminal P161 is arranged at a position outward of the other end of the semiconductor element 20 in the second direction and on the side closer to the one end of the semiconductor element 20 (i.e., on the opposite side to the circuits for the power supply system and the control system) than the input/output terminal P261 in the first direction.

In the above-described configuration, as illustrated in FIG. 1A, when a high frequency signal is inputted from the external connection terminal P111, the high frequency signal is transferred to the common terminal P20 through the wiring conductor 31, the input/output terminal P211, and the FET 211, and further transferred from the common terminal P20 to the external connection terminal P10 through the wiring conductor 30. On that occasion, in a signal path from the external connection terminal P111 to the common terminal P20 and a signal path from the common terminal P20 to the external connection terminal P10, a transfer direction of the signal is not reversed. In other words, there is no region where a propagation direction DP1 of high frequency power from the external connection terminal P111 to the common terminal P20 and a propagation direction DPA of the high frequency power from the common terminal P20 to the external connection terminal P10 are opposed to each other. The propagation direction DP1 of the high frequency signal power from the external connection terminal P111 to the common terminal P20 is substantially the same as a signal propagation direction in the wiring conductor 31 connecting the external connection terminal P111 and the input/output terminal P211, i.e., a direction in which the wiring conductor 31 extends when viewed in a plan view. The propagation direction DPA of the high frequency power from the common terminal P20 to the external connection terminal P10 is substantially the same as a signal propagation direction in the wiring conductor 30 connecting the common terminal P20 and the input/output terminal P10, i.e., a direction in which the wiring conductor 30 extends when viewed in a plan view. The above point is similarly applied to the cases in which high frequency signals are input from the external connection terminals P121, P131 and P141.

On the other hand, as illustrated in FIG. 1A, when a high frequency signal is inputted from the external connection terminal P151, the high frequency signal is transferred to the common terminal P20 through the wiring conductor 35, the input/output terminal P251, and the FET 251, and further transferred from the common terminal P20 to the external connection terminal P10 through the wiring conductor 30. On that occasion, in a signal path from the external connection terminal P151 to the common terminal P20 and a signal path from the common terminal P20 to the external connection terminal P10, a transfer direction of the signal is reversed at a certain point. In other words, there is a region where a propagation direction DP5 of the high frequency power from the external connection terminal P151 to the common terminal P20 and the propagation direction DPA of the high frequency power from the common terminal P20 to the external connection terminal P10 are opposed to each other.

The propagation direction DP5 of the high frequency power from the external connection terminal P151 to the common terminal P20 is substantially the same as a signal propagation direction in the wiring conductor 35 connecting the external connection terminal P151 and the input/output terminal P251, i.e., a direction in which the wiring conductor 35 extends when viewed in a plan view.

Here, the case in which a propagation direction of one signal and a propagation direction of another signal are opposed to each other implies, for example, the case in which an angle formed by a propagation direction of one signal (i.e., a signal propagation direction in a wiring conductor through which the one signal is transferred) and a propagation direction of another signal (i.e., a signal propagation direction in a wiring conductor through which the other signal is transferred) is an acute angle. In other words, the above-described case implies the case in which an angle formed by an extension line of the wiring conductor through which the one signal is transferred and an extension line of the wiring conductor through which the other signal is transferred is an acute angle.

Thus, because an angle formed by an extension line of the wiring conductor 35 and an extension line of the wiring conductor 30 is an acute angle (angle A) as illustrated in FIG. 1B, the propagation direction DP5 of the signal transferred through the wiring conductor 35 and the propagation direction DPA of the signal transferred through the wiring conductor 30 are opposed to each other.

Furthermore, the case in which a propagation direction of one signal and a propagation direction of another signal are not opposed to each other implies, for example, the case in which an angle formed by a propagation direction of one signal (i.e., a signal propagation direction in a wiring conductor through which the one signal is transferred) and a propagation direction of another signal (i.e., a signal propagation direction in a wiring conductor through which the other signal is transferred) is an obtuse angle. In other words, the above-described case implies the case in which an angle formed by an extension line of the wiring conductor through which the one signal is transferred and an extension line of the wiring conductor through which the other signal is transferred is an obtuse angle.

Thus, because an angle formed by an extension line of the wiring conductor 31 and the extension line of the wiring conductor 30 is an obtuse angle (angle B) as illustrated in FIG. 1B, the propagation direction DP1 of the signal transferred through the wiring conductor 31 and the propagation direction DPA of the signal transferred through the wiring conductor 30 are not opposed to each other.

In a general high-frequency circuit module, when a plurality of signal paths are arranged parallel and positioned close to each other, there is a possibility that electromagnetic coupling may occur between the signal paths. The occurrence of the electromagnetic coupling between the signal paths changes the inductances of the individual transfer paths, including those signal paths, depending on a distance through which the signal paths extend parallel to each other and power propagation directions. For example, in a region where the power propagation directions are opposite to each other between the signal paths, the electromagnetic coupling occurs as negative electromagnetic coupling that magnetic fluxes generated from the signal paths cancel each other. On the other hand, in a region where the power propagation directions are not opposite to each other between the signal paths, such negative electromagnetic coupling does not occur. In the region where the negative electromagnetic coupling occurs between the signal paths, inductance is reduced in comparison with that in the region where the negative electromagnetic coupling does not occur between the signal paths.

In the high frequency switch, described above as the prior art, including the plurality of FETs having the same structure, when transfer lines causing different inductances as mentioned above are connected to the plurality of FETs, insertion loss varies for each of the transfer lines selected by the FETs. For example, when impedance matching is established for transfer paths not causing the negative electromagnetic coupling between signal paths, impedance matching becomes insufficient for transfer paths causing the negative electromagnetic coupling between signal paths, and the insertion loss increases.

In the high frequency switch 10 of this application, however, the semiconductor element 20 is constituted such that, as illustrated in FIG. 2, a gate width Wg251 of the FET 251 is wider than a gate width Wg211 of the FET 211.

On that condition, the power of a signal transferred between the drain and the source of the FET 251 is greater than the power of a signal transferred between the drain and the source of the FET 211. Therefore, the loss in a first transfer path through the FET 251 can be cancelled by a decrease of the electric resistance resulting from the wider gate width of the FET 251, i.e., by an increase of the power of the signal transferred between the drain and the source. It is hence possible to reduce a deviation in insertion loss between the first transfer path through the FET 251 and a second transfer path through the FET 211. In addition, since the first transfer path generating larger insertion loss is compensated for to generate the insertion loss closer to that in the second transfer path, the insertion loss in the entirety of the high frequency switch 10 can be reduced. Thus, the performance of the high frequency switch 10 is increased.

Furthermore, a gate width Wg261 of the FET 261 is also set to be wider than a gate width Wg221 of the FET 221. In this connection, the gate width Wg261 of the FET 261 is preferably the same as the gate width Wg251 of the FET 251. On that condition, symmetry is held between the FET 251 and the FET 261. Moreover, a gate width of the FET 231 is substantially the same as the gate width Wg211 of the FET 211, and a gate width of the FET 241 is substantially the same as the gate width Wg221 of the FET 221.

In the high frequency switch 10, as described above, the deviation in insertion loss between the transfer paths can be reduced by setting, for the transfer path in which the power propagation direction is reversed halfway and the transfer path in which the power propagation direction is not reversed, the gate widths of the FETs connected to those transfer paths to be different from each other.

The deviation in insertion loss between the transfer lines is, for example, about 0.1 dB in the case of not using the configuration of the high frequency switch 10 and setting the gate widths of the FETs equal to each other, but it is reduced to about 0.02 dB by using the configuration of the high frequency switch 10. Stated in another way, in the high frequency switch 10, the gate widths of the FET 251 and the FET 261 are set to be wider than those of the FET 211, the FET 221, the FET 231, and the FET 241 such that the deviation in insertion loss becomes about 0.02 dB.

Furthermore, in the high frequency switch 10, the plurality of FETs and input/output terminals are arranged in line symmetry with respect to a reference line passing the common terminal P20 and being parallel to the first direction. This can also reduce the deviation in insertion loss between the transfer lines.

Moreover, in the high frequency switch 10, the common terminal P20 is arranged in a central region of the semiconductor element 20. In comparison with the case in which the common terminal P20 is arranged in an end portion of the semiconductor element 20 on the side closer to the external connection terminal P10, therefore, a length of the wiring conductor 30 extending from the common terminal P20 to the external connection terminal P10 can be increased, and inductance for matching can be increased. As a result, the high frequency signal can be transferred with lower loss for any transfer path, and the high frequency switch 10 having lower insertion loss can be realized.

While this embodiment represents the case of adjusting the resistance of the FET with the gate width, the resistance of the FET may be adjusted with a gate length or a doping amount.

Figure 4:
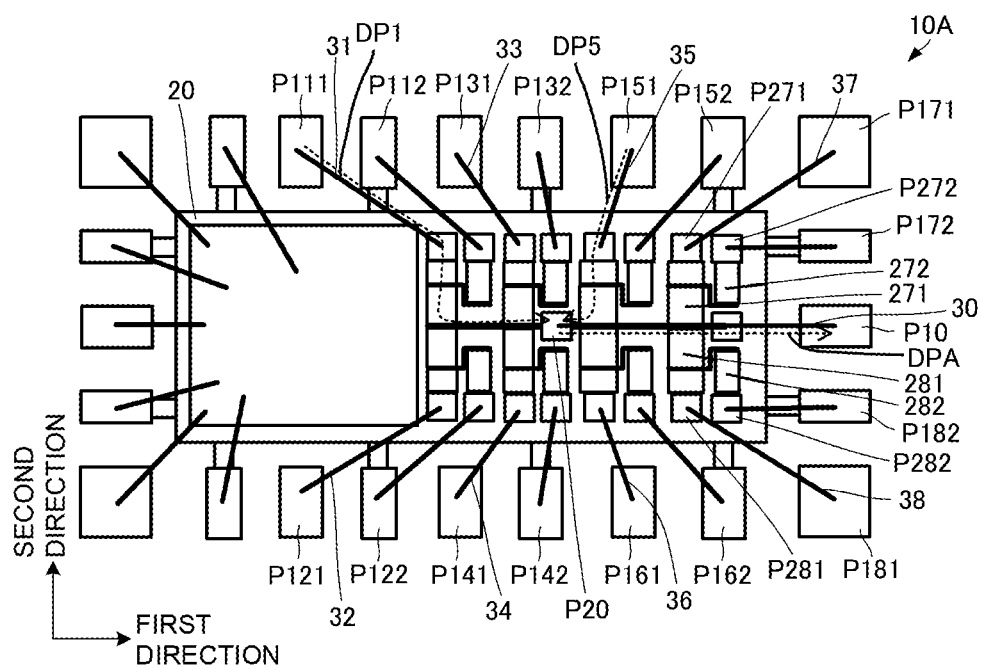
FIG. 4 is a plan view illustrating a layout of individual terminals and power propagation directions in a high frequency switch 10A having a derivative configuration.

While the above description has been made, by way of example, in connection with the high frequency switch 10 of SP6T type, it is also possible to apply the above-described configuration to an SPnT-type (n is an integer of 2 or more) switch and to obtain similar advantageous effects. FIG. 4 is a plan view illustrating a layout of individual terminals and power propagation directions in a high frequency switch 10A having a derivative configuration. FIG. 4 illustrates an SP8T-type high frequency switch 10A.

As illustrated in FIG. 4, the high frequency switch 10A is different from the high frequency switch 10 in adding input/output terminals P271, P272, P281 and P282, external connection terminals P171, P172, P181 and P182, and FETs 271, 272, 281 and 282 to the high frequency switch 10. The other configuration of the high frequency switch 10A is similar to the basic configuration of the high frequency switch 10, and description of similar components is omitted.

In the high frequency switch 10A, the FETs 271, 272, 281 and 282 are arranged on the one-end side of the semiconductor element 20 in the first direction relative to the common terminal P20. Similarly, the input/output terminals P271, P272, P281 and P282 are also arranged on the one-end side of the semiconductor element 20 in the first direction relative to the common terminal P20. The input/output terminal P271 is connected to the external connection terminal P171 through a wiring conductor 37 having a substantially linear shape when viewed in a plan view. The input/output terminal P281 is connected to the external connection terminal P181 through a wiring conductor 38 having a substantially linear shape when viewed in a plan view.

In the above-described configuration, gate widths of the FETs 271 and 281 are adjusted in comparison with those of the FETs 211, 221, 231 and 241. For example, as in the gate widths of the FETs 251 and 261, the gate widths of the FETs 271 and 281 are set to be wider than those of the FETs 211, 221, 231 and 241. On that occasion, the gate widths of the FETs 271 and 281 are not always required to be the same as those of the FETs 251 and 261. With such a configuration, the high frequency switch 10A can also provide similar advantageous effects to those in the high frequency switch 10. In some cases, the gate widths of the FETs 271 and 281 are not required to be widened as in the FETs 251 and 261 depending on other factors attributable to the semiconductor element 20. In such cases, the gate widths of the FETs 271 and 281 may be set as appropriate depending on the specifications of the high frequency switch 10A.

The above-described configuration represents the case in which the plurality of FETs, the plurality of input/output terminals, and the plurality of external connection terminals are arranged in symmetry with respect to the common terminal P20. Even in the case of not having the symmetry, however, the above-described configuration can be applied and the above-described advantageous effects can be obtained insofar as a high frequency switch includes a plurality of transfer paths having different lengths of zones in which the power propagation directions are opposite to each other (length of one of the zones may be 0).

Figure 5:
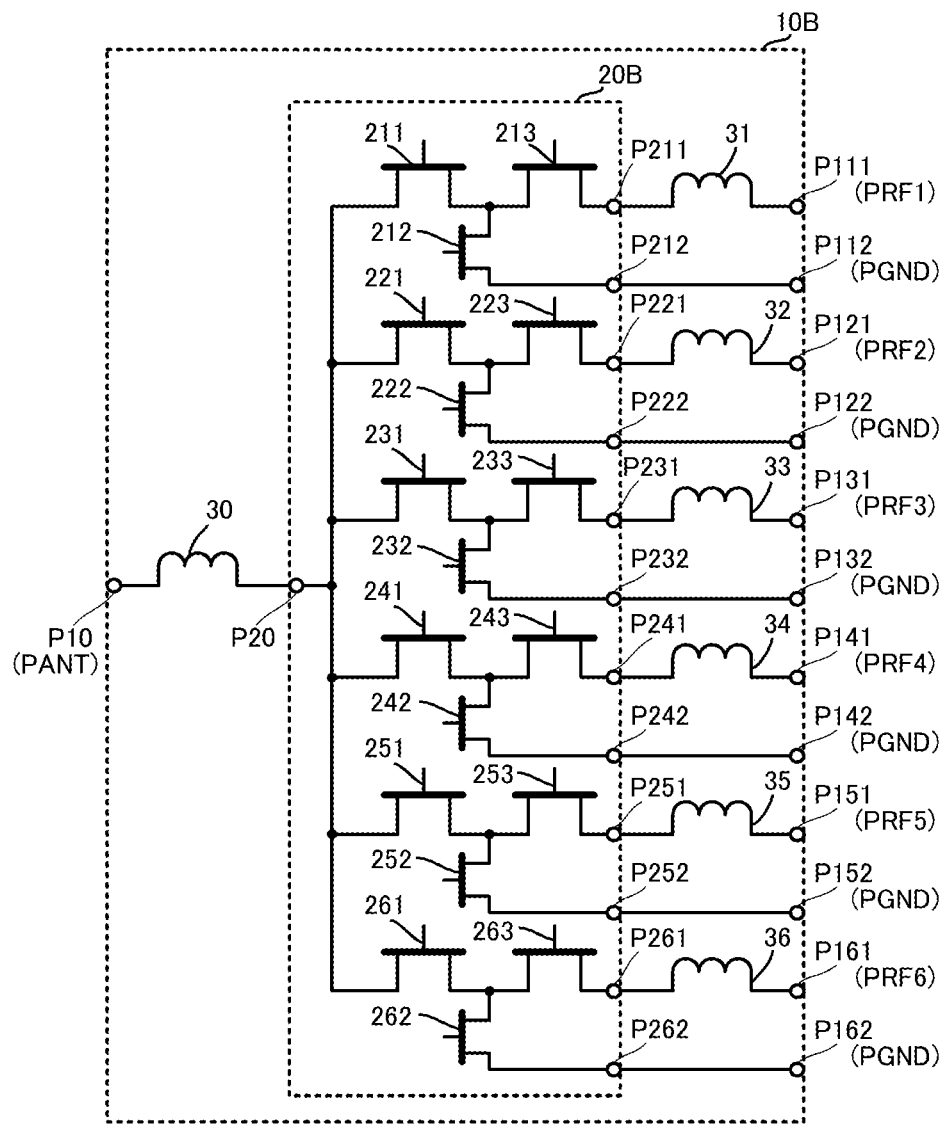
FIG. 5 is a circuit diagram of a high frequency switch 10B according to a second embodiment of the present disclosure.
Figure 6:
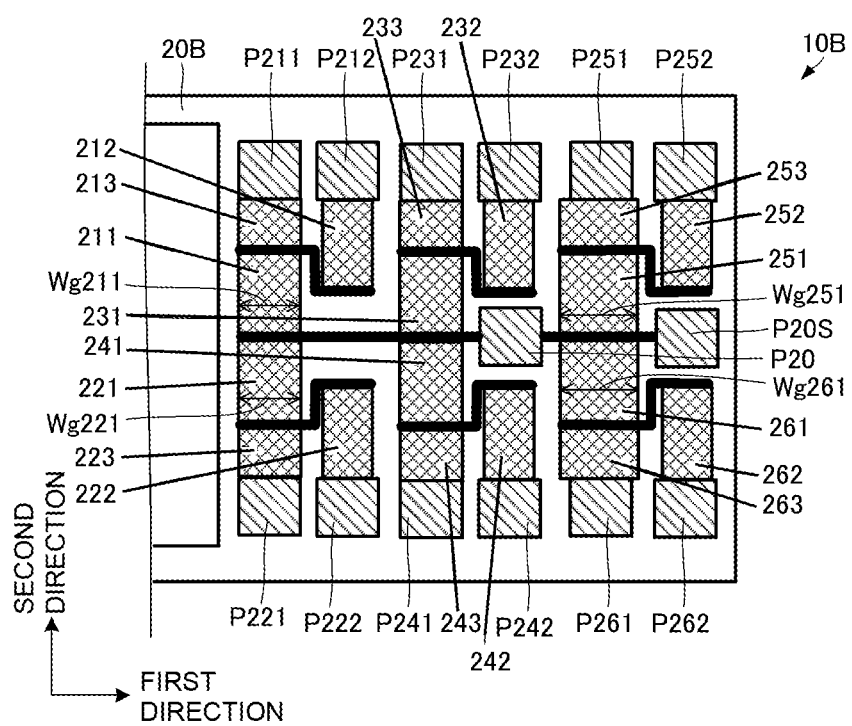
FIG. 6 is a plan view illustrating, in an enlarged scale, a portion of a semiconductor element 20B in the high frequency switch 10B according to the second embodiment of the present disclosure.

FIG. 5 is a circuit diagram of a high frequency switch 10B according to a second embodiment of the present disclosure. FIG. 6 is a plan view illustrating, in an enlarged scale, a portion of a semiconductor element 20B in the high frequency switch 10B according to the second embodiment of the present disclosure.

As illustrated in FIGS. 5 and 6, the high frequency switch 10B according to the second embodiment is different from the high frequency switch 10 according to the first embodiment in adding FETs 213, 233, 233, 243, 253 and 263. The other configuration of the high frequency switch 10B is similar to that of the high frequency switch 10, and description of similar components is omitted.

As illustrated in FIGS. 5 and 6, the semiconductor element 20B includes the plurality of FETs 211, 212, 213, 221, 222, 223, 231, 232, 233, 241, 242, 243, 251, 252, 253, 261, 262 and 263.

The FET 213 is connected in series between the FET 211 and the input/output terminal P211. The FET 212 is connected in series between the ground terminal P212 and a junction between the FET 211 and the FET 213.

The FET 223 is connected in series between the FET 221 and the input/output terminal P221. The FET 222 is connected in series between the ground terminal P222 and a junction between the FET 221 and the FET 223.

The FET 233 is connected in series between the FET 231 and the input/output terminal P231. The FET 232 is connected in series between the ground terminal P232 and a junction between the FET 231 and the FET 233.

The FET 243 is connected in series between the FET 241 and the input/output terminal P241. The FET 242 is connected in series between the ground terminal P242 and a junction between the FET 241 and the FET 243.

The FET 253 is connected in series between the FET 251 and the input/output terminal P251. The FET 252 is connected in series between the ground terminal P252 and a junction between the FET 251 and the FET 253.

The FET 263 is connected in series between the FET 261 and the input/output terminal P261. The FET 262 is connected in series between the ground terminal P262 and a junction between the FET 261 and the FET 263.

Thus, the semiconductor element 20B has a configuration in which a switch circuit having T-type topology is connected between the common terminal P20 and each of the input/output terminals P211, P221, P231, P241, P251 and P261.

The high frequency switch 10B having the above-described configuration can also reduce the deviation in insertion loss between the transfer paths as with the high frequency switch 10 according to the first embodiment.

The above description represents the case of including plural sets of the transfer path in which the power propagation direction is reversed halfway and the transfer path in which the power propagation direction is not reversed. However, just on condition that the high frequency switch includes one transfer path in which the power propagation direction is reversed halfway and one transfer path in which the power propagation direction is not reversed, similar advantageous effects to those described above can be obtained by applying the features of the present disclosure to those transfer paths.

Furthermore, the above description represents the case of including both the transfer path in which the power propagation direction is reversed halfway and the transfer path in which the power propagation direction is not reversed. However, even when the high frequency switch includes a plurality of transfer paths in which the power propagation direction is reversed and lengths of zones of those transfer paths in which the power propagation direction is reversed are different from each other, similar advantageous effects to those described above can also be obtained by performing, for example, the above-described adjustment of the gate widths. Here, the length of the zone in each of the transfer paths in which the power propagation direction is reversed halfway implies shorter one of a distance between the external connection terminal and the common terminal and a distance between the common terminal and the common-terminal-dedicated external connection terminal in each transfer path. For example, in the transfer path passing through the external connection terminal P151, the common terminal P20, and the common-terminal-dedicated external connection terminal P10 and representing the transfer path in which the power propagation direction is reversed halfway in the high frequency switch 10 according to the first embodiment, the length of the zone in which the power propagation direction is reversed implies shorter one of a distance between the external connection terminal P151 and the common terminal P20 and a distance between the common terminal P20 and the common-terminal-dedicated external connection terminal P10.

10, 10A, 10B: high frequency switch
20, 20B: semiconductor element
30, 31, 32, 33, 34, 35, 36, 37, 38: wiring conductor
211, 212, 213, 221, 222, 223, 231, 232, 233, 241, 242, 243, 251, 252, 253, 261, 262, 263, 271, 281: FET
AR1: area
P10, P111, P112, P121, P122, P131, P132, P141, P142, P151, P152, P161, P162, P171, P172, P181, P182: external connection terminal
P20, P20S: common terminal
P211, P221, P231, P241, P251, P261, P271, P281: input/output terminal,
P212, P222, P232, P242, P252, P262, P272, P282: ground terminal,
Wg211, Wg251: gate width

The invention claimed is:

1. A high frequency switch comprising:
a semiconductor element in which a first plurality of FETs including at least a first FET and a second FET are provided;
a plurality of external connection terminals; and
a molded member encapsulating the semiconductor element,
the semiconductor element comprising:
a common terminal;
a plurality of input/output terminals including at least a first terminal and a second terminal; and
the first FET connected between the common terminal and the first terminal, and the second FET connected between the common terminal and the second terminal,
the plurality of external connection terminals including a common-terminal-dedicated external connection terminal connected to the common terminal, a first external connection terminal connected to the first terminal, and a second external connection terminal connected to the second terminal,
wherein, in a configuration satisfying that a length of a zone in which a signal propagation direction from the first external connection terminal toward the common terminal and a signal propagation direction from the common terminal toward the common-terminal-dedicated external connection terminal face each other and form an acute angle is longer than a length of a zone in which a signal propagation direction from the second external connection terminal toward the common terminal and a signal propagation direction from the common terminal toward the common-terminal-dedicated external connection terminal face each other and form an obtuse angle,
the first FET and the second FET are configured such that a power of a first signal that was received from the first terminal and is transferred between a drain and a source of the first FET in accordance with a predetermined input power is greater than a power of a second signal that was received from the second terminal and is transferred between a drain and a source of the second FET.

2. A high frequency switch comprising:
a semiconductor element in which a first plurality of FETs including at least a first FET and a second FET are provided;
a plurality of external connection terminals; and
a molded member encapsulating the semiconductor element,
the semiconductor element comprising:
a common terminal;
a plurality of input/output terminals including at least a first terminal and a second terminal; and
the first FET connected between the common terminal and the first terminal, and the second FET connected between the common terminal and the second terminal,
the plurality of external connection terminals including a common-terminal-dedicated external connection terminal connected to the common terminal, a first external connection terminal connected to the first terminal, and a second external connection terminal connected to the second terminal,
wherein, in a configuration satisfying that a length of a zone in which a signal propagation direction from the first external connection terminal toward the common terminal and a signal propagation direction from the common terminal toward the common-terminal-dedicated external connection terminal face each other and form an acute angle is longer than a length of a zone in which a signal propagation direction from the second external connection terminal toward the common terminal and a signal propagation direction from the common terminal toward the common-terminal-dedicated external connection terminal face each other and form an obtuse angle; and
a gate width of the first FET is wider than a gate width of the second FET.

3. The high frequency switch according to claim 1, further comprising:
a first wiring conductor connected between the first external connection terminal and the first terminal;
a second wiring conductor connected between the second external connection terminal and the second terminal; and
a third wiring conductor connected between the common terminal and the common-terminal-dedicated external connection terminal,
wherein the signal propagation direction from the first external connection terminal toward the common terminal is a signal propagation direction in the first wiring conductor,
the signal propagation direction from the second external connection terminal toward the common terminal is a signal propagation direction in the second wiring conductor, and
the signal propagation direction from the common terminal toward the common-terminal-dedicated external connection terminal is a signal propagation direction in the third wiring conductor.

4. The high frequency switch according to claim 3, wherein the high frequency switch has the zone in which the signal propagation direction from the first external connection terminal toward the common terminal and the signal propagation direction from the common terminal toward the common-terminal-dedicated external connection terminal face each other and form the acute angle, and
the high frequency switch does not have the zone in which the signal propagation direction from the second external connection terminal toward the common terminal and the signal propagation direction from the common terminal toward the common-terminal-dedicated external connection terminal face each other and form the obtuse angle.

5. The high frequency switch according to claim 4, wherein an angle provided by an extension line of the first wiring conductor and an extension line of the third wiring conductor is an acute angle, and
  an angle provided by an extension line of the second wiring conductor and the extension line of the third wiring conductor is an obtuse angle.

6. The high frequency switch according to claim 1, wherein the first terminal and the second terminal are aligned in a first direction of the semiconductor element, and
  the common terminal is arranged between the first terminal and the second terminal in the first direction.

7. The high frequency switch according to claim 6, wherein the semiconductor element further comprises a second plurality of FETs each connected between corresponding ones among the plurality of input/output terminals and the common terminal, and
  the plurality of input/output terminals and the second plurality of FETs are arranged in a state arrayed in the first direction and a second direction perpendicular to the first direction.

8. The high frequency switch according to claim 7, wherein the common-terminal-dedicated external connection terminal is positioned on a same side as the first external connection terminal and on an opposite side to the second external connection terminal with respect to a linear line parallel to the second direction and intersecting with the common terminal.

9. The high frequency switch according to claim 1, wherein the common terminal is arranged substantially at a center when the semiconductor element is viewed in a plan view.

10. The high frequency switch according to claim 2, further comprising:
  a first wiring conductor connected between the first external connection terminal and the first terminal;
  a second wiring conductor connected between the second external connection terminal and the second terminal; and
  a third wiring conductor connected between the common terminal and the common-terminal-dedicated external connection terminal,
  wherein the signal propagation direction from the first external connection terminal toward the common terminal is a signal propagation direction in the first wiring conductor,
  the signal propagation direction from the second external connection terminal toward the common terminal is a signal propagation direction in the second wiring conductor, and
  the signal propagation direction from the common terminal toward the common-terminal-dedicated external connection terminal is a signal propagation direction in the third wiring conductor.

11. The high frequency switch according to claim 2, wherein the first terminal and the second terminal are aligned in a first direction of the semiconductor element, and
  the common terminal is arranged between the first terminal and the second terminal in the first direction.

12. The high frequency switch according to claim 3, wherein the first terminal and the second terminal are aligned in a first direction of the semiconductor element, and
  the common terminal is arranged between the first terminal and the second terminal in the first direction.

13. The high frequency switch according to claim 4, wherein the first terminal and the second terminal are aligned in a first direction of the semiconductor element, and
  the common terminal is arranged between the first terminal and the second terminal in the first direction.

14. The high frequency switch according to claim 5, wherein the first terminal and the second terminal are aligned in a first direction of the semiconductor element, and
  the common terminal is arranged between the first terminal and the second terminal in the first direction.

15. The high frequency switch according to claim 2, wherein the common terminal is arranged substantially at a center when the semiconductor element is viewed in a plan view.

16. The high frequency switch according to claim 3, wherein the common terminal is arranged substantially at a center when the semiconductor element is viewed in a plan view.

17. The high frequency switch according to claim 4, wherein the common terminal is arranged substantially at a center when the semiconductor element is viewed in a plan view.

18. The high frequency switch according to claim 5, wherein the common terminal is arranged substantially at a center when the semiconductor element is viewed in a plan view.

19. The high frequency switch according to claim 6, wherein the common terminal is arranged substantially at a center when the semiconductor element is viewed in a plan view.

20. The high frequency switch according to claim 7, wherein the common terminal is arranged substantially at a center when the semiconductor element is viewed in a plan view.

* * * * *